United States Patent
Hornbostel et al.

(10) Patent No.: US 6,225,550 B1
(45) Date of Patent: May 1, 2001

(54) THERMOELECTRIC MATERIAL SYSTEM

(75) Inventors: Marc Hornbostel, Palo Alto; William B. Archibald, Hillsborough, both of CA (US)

(73) Assignee: Symyx Technologies, Inc., Santa Clara, CA (US)

( * ) Notice: Subject to any disclaimer, the term of this patent is extended or adjusted under 35 U.S.C. 154(b) by 0 days.

(21) Appl. No.: 09/393,851

(22) Filed: Sep. 9, 1999

(51) Int. Cl.[7] .................................................. H01L 35/12
(52) U.S. Cl. .................... 136/236.1; 136/203; 136/205; 136/238; 136/239; 136/240; 136/241
(58) Field of Search ................................. 136/203, 205, 136/236.1, 238, 239, 240, 241

(56) References Cited

U.S. PATENT DOCUMENTS 5,610,366  3/1997  Fleurial et al. .................... 136/202

OTHER PUBLICATIONS

The antimony–rich parts of the ternary systems calcium, strontium, barium and cerium with iron and antimony; structure refinements of the LaFe4Sb12–type compounds SrFe4Sr12 and CeFe4Sb12; the new compounds CaOs4Sb12 and YbOs4Sb12, Joachim W. Kaiser and W.* Nickel–substituted Skutterudites: synthesis, structural and electrical properties, L. Chapon, D. Ravot, and J.C. Tednac, Journal of Alloys and Compounds 282 (1999) 58–63, No month/1999.*

Pearson's Handbook: Crystallographic Data for Intermetallic Phases, Desk Edition, vols. 1 and 2, P. Villars, Ed., ASM International, Materials Park (1997) (excerpt regarding $Mg_3Sb_2$), pp. 2347–2348.

Verbrugge, Dawn M.; Van Zytveld, J.B., "Electronic Properties of Liquid MgSb," Journal of Non–Crystalline Solids, Elsevier Science Publishers B.V., p. 736–739, (1993), No month provided.

Bohmeier, H; Kunert, W.; Raschke, M.; Gotsch, A., "Kontaktwerkstoffe fur Vakuumleistungsschalter auf NE–Metall--Basis," Electrie 31, vol. 31 (No. 9), p. 490–491, (1997), No month provided.

Merlo, F; Pani, M.; Fornasini, M.L., "RMX Compounds Formed by Alkaline Earths Europium and Ytterbium–I. Ternary Phases with M=Cu, Ag, Au X=Sb,Bi," Journal of Less Common Metals, vol. 166 (No. 2), p. 1990–1911, (Nov., 1990).

Verbrugge D. M. et al., "Liquid Semiconductor and Thermoelectric Power Generation: MG–SB," Journal of Physics D. Applied Physics, IOP Publishing (Bristol, GB), vol. 26 (No. 10), p. 1722–1726, (Mar. 1993).

Kajikawa T. et al., "Thermoelectric Properties Control Due to Doping Level and Sinteringconditions for FGM Thermoelectric Element," Materials Science, Forum, vols. 308–311 (Aedermannsfdorf, CH), p. 687–692, (1999), No month provided.

K.A. Bol'Shakov et al., 'Russian Journal of Inorganic Chemistry, Translated from Zhurnal Neorgranicheskoi Khimii,' vol. 8 (No. 12), p. 1418–1421, (1963), No month available.

* cited by examiner

Primary Examiner—Kathryn Gorgos
Assistant Examiner—Thomas H Parsons
(74) Attorney, Agent, or Firm—Dobrusin Darden Thennisch & Lorenz PC

(57) ABSTRACT

An improved material for a thermoelectric device and thermoelectric systems incorporating the same.

35 Claims, 2 Drawing Sheets

THERMOELECTRIC MATERIAL SYSTEM

STATEMENT REGARDING FEDERALLY SPONSORED RESEARCH OR DEVELOPMENT

The present invention was made under DARPA/ONR Contract No. N00014-98-C-0288. The United States Government may have certain rights in it.

BACKGROUND OF THE INVENTION

1. Field of the Invention

The present invention relates generally to thermoelectric devices, and more particularly to an improved thermoelectric system employing a novel magnesium antimonide semiconductor.

2. Description of the Related Art

Thermoelectric devices have been employed popularly for a many years, largely in connection with temperature regulation systems, such as heating and cooling. Thermoelectric devices of the type involved here are ordinarily solid state devices that function as heat pumps to transfer heat to or from a specific location. Fundamentally they operate under the same principles as do refrigerators or other mechanical heat pumps.

As the skilled artisan will appreciate, the viability of a material to function as a thermoelectric device depends on the efficiency of the material. See, U.S. Pat. No. 5,610,366, hereby expressly incorporated by reference. In that patent, the applicants address the dimensionless figure of merit ZT, which is related to the efficiency of the material to function as a thermoelectric device. That patent also points out how the most popularly employed materials for thermoelectric devices were developed several decades ago. Examples include those listed in that patent as well as $Sb_2Te_3$ and $Bi_2Te_3$. These materials typically have exhibited a ZT of about 1, and no greater than about 1.2 (under limited operational ranges). Moreover, materials such as $Bi_2Te_3$, because of their anisotropic structure, require special processing to produce crystallographically oriented materials.

Particularly in view of technological advances requiring efficient heat transfer (e.g., for space applications, or other sensitive electronic device applications), a need has arisen for an improved material for thermoelectric device, particularly one that exhibits a ZT greater than about 0.4. Further, owing to the broad range of conditions to which the devices will be subjected, it is important for the material to yield consistent and reproducible results through a broad range of operating conditions. It is also desirable to provide a material that can be handled readily and is easy to process, so that impracticalities traditionally associated with manufacture of thermoelectric devices can be avoided.

A discussion of crystal structures for various binary intermetallic phases can be found at *Pearson's Handbook: Crystallographic Data for Intermetallic Phases, Desk Edition*, Vols. 1 and 2, P. Villars, Ed., ASM International, Materials Park (1997). Heretofore, it is believed that the only reported binary intermetallic phase of $Mg_xSb_y$ is $Mg_3Sb_2$. $Mg_3Sb_2$ crystallizes in the trigonal anti-$La_2O_3$ structure at room temperature and undergoes a structural transition to a high temperature beta phase that crystallizes in the body centered cubic structure of $Mn_2O_3$. Also of potential interest is K. A. Bol'shakov et al., Russian Journal of Inorganic Chemistry, Translated from Zhurnal Neorganicheskoi Khimii, 8, (12), 1418–1424 (1963).

SUMMARY OF THE INVENTION

The present invention overcomes the shortcomings of the prior art by providing an improved thermoelectric material and system. In a preferred embodiment, the material is based upon the system $A_xM_yB_z$, where A is one or more element selected from the group consisting of Be, Mg, Ca, Sr, Ba, Al, Y, La, Ce, Pr, Nd, Pm, Sm, Eu, Gd, Tb, Dy, Ho, Er, Tm, Yb, Lu, Sc and mixtures thereof; B is one or more element selected from the group consisting of P, As, Sb, Bi, Ge, Sn, Pb, Si, Se, Te and mixtures thereof; and M is a transition metal, a noble metal, or a mixture thereof; and further where x ranges from about 59 to about 72, and y ranges up to about 15, and z ranges from about 25 to about 33. In one preferred embodiment, A and B adopt an anti-$CaF_2$ structure type. In a highly preferred embodiment, the material is $Mg_xSb_z$ further doped with another element, preferably a transition metal. Thermoelectric devices can be prepared using the material of the present invention.

The material exhibits a ZT of at least about 0.4, and is capable of exhibiting a ZT of at least about 1.2, a resistivity of at most about 30 milliohms-cm, a band gap of at least about 0.05 eV, and an estimated Seebeck coefficient in excess of about 1000 microvolts/K at room temperature. The material is generally isotropic and thus optionally does not require manufacture in a specific crystallographic orientation.

BRIEF DESCRIPTION OF THE DRAWINGS

A more complete understanding of the present invention and its advantages can be had by reference to the following detailed description, and the accompanying drawings in which.

DETAILED DESCRIPTION OF PREFERRED EMBODIMENT

Figure 1:
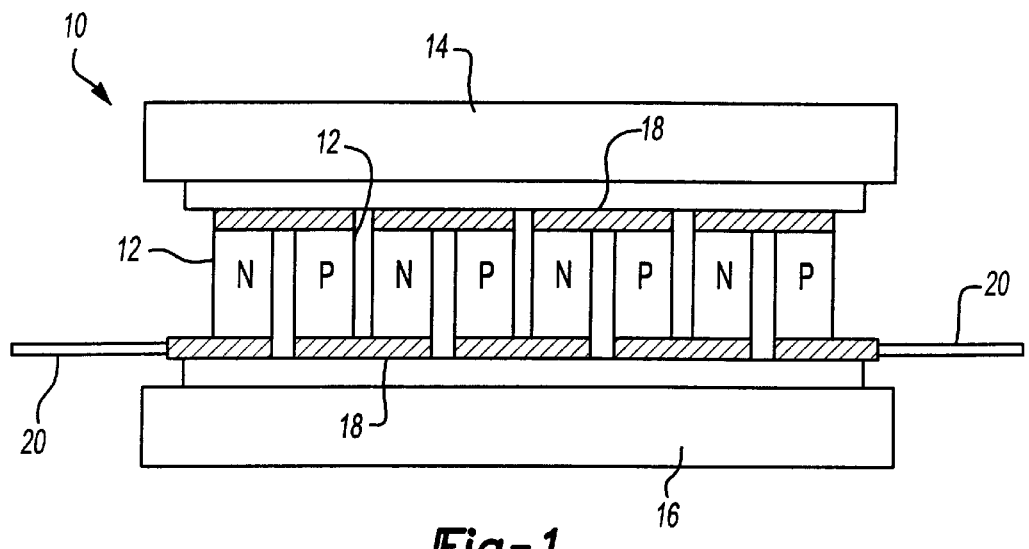
FIG. 1 is an elevational drawing of a thermoelectric device that can be prepared in accordance with the present invention.

FIG. 1 illustrates one example of a thermoelectric device 10 made in accordance with the present invention. The device 10 includes a plurality of thermoelectric elements 12 (which are shown as columns and preferably alternate between n-type and p-type doped semiconductors) disposed between first and second support elements 14 and 16. Associated with each of the support elements are conductors 18 for bridging electrical communication between the thermoelectric elements. In operation, current (e.g., DC) is passed through the conductors through electrodes 20 associated with the support elements. The thermoelectric elements transport heat from one support element to another (i.e., as a heat pump). Alternatively, heat can be applied to generate a current (i.e., as a heat engine). A further alternative is for the device to function as a sensor in which differences in temperature can be translated to measurable voltage.

Unless otherwise specified, all percentages specified herein are atomic percentages, and properties and characteristics are approximately room temperature values. The thermoelectric materials of the present invention are based upon a family of semiconductor materials having the general formula $A_xB_y$, where A is one or more element selected from the group consisting of Be, Mg, Ca, Sr, Ba, Al, Y, La, Ce, Pr, Nd, Pm, Sm, Eu, Gd, Th, Dy, Ho, Er, Tm, Yb, Lu, Sc and mixtures thereof; and B is one or more element selected from the group consisting of P, As, Sb, Bi, Ge, Pb, Se, Te and mixtures thereof. Optionally, elements such as Sn, Si or mixtures thereof can be used in combination with another element in B. More preferably, A is one or more element selected from the group consisting of Mg, Ca, Y and mixtures thereof. Further, more preferably, B is one or more element selected from the group consisting of Sb, Pb, Ge and mixtures thereof. In a still more preferred embodiment A is Mg and B is Sb.

In one embodiment, the value of x ranges from about 67 to about 75, more preferably about 67 to about 70, with the balance being y. In a still more preferred embodiment, where A and B respectively are Mg and Sb, the preferred stoichiometry is about $Mg_2Sb$, or about 2 atoms magnesium per atom of Sb.

In another preferred embodiment, the base family of semiconductor material is doped to provide a suitable n-type or p-type semiconductor. Any of a number of known dopant techaniques may be used, such as (without limitation) introducing vacancies, substitution of elements, introduction of interstitial atoms, or otherwise. By way of illustration, in one embodiment, one or more of three categories of substitutions may be employed. For instance, an element M may substitute for Mg, whereby the resulting composition would be represented by the formula $Mg_{67-y}M_ySb_{33}$ Another alternative is where M substitutes for Sb so that the composition may be represented as $Mg_{67}M_ySb_{33-y}$. Yet another alternative contemplates, M as an interstitial ion. In general, the material is represented as $Mg_xM_ySb_z$.

Preferably M is one or more element selected from the group consisting of Cu, Ag, Au, Pd, Pt, Ni, Cu, Ag, Au, Pd, Pt, Ni, Mn, Fe, Co, Ni, Zn, and mixtures thereof; more preferably it is one or more element selected from the group consisting of Cu, Ag, Mn, Fe, Co, Ni, Zn and mixtures thereof and still more preferably it is copper.

For the above, the values of x range from about 59 to about 72, more preferably about 61 to about 68. The value of y ranges up to about 15, more preferably from about 2 to about 8, and still more preferably from about 4 to about 6. The value of z ranges from about 25 to about 33, and more preferably about 26 to about 33.

Figure 3:
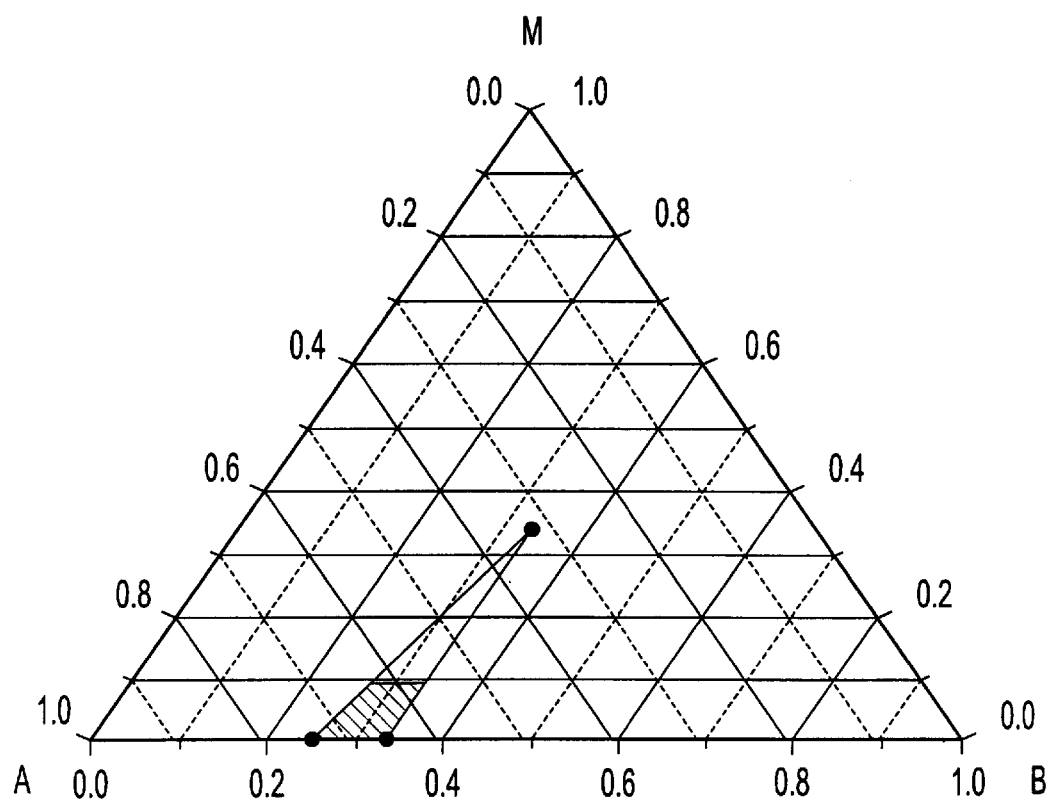
FIG. 3 is a ternary phase diagram to illustrate one example of a preferred set of compositions for the thermoelectric materials of the present invention.

FIG. 3 illustrates one preferred ternary system that identifies a preferred range of compositions (by atomic percent), shown by the cross-hatched region. The range is particularly suitable for systems where A is Mg, B is Sb and M is Cu.

Figure 2:
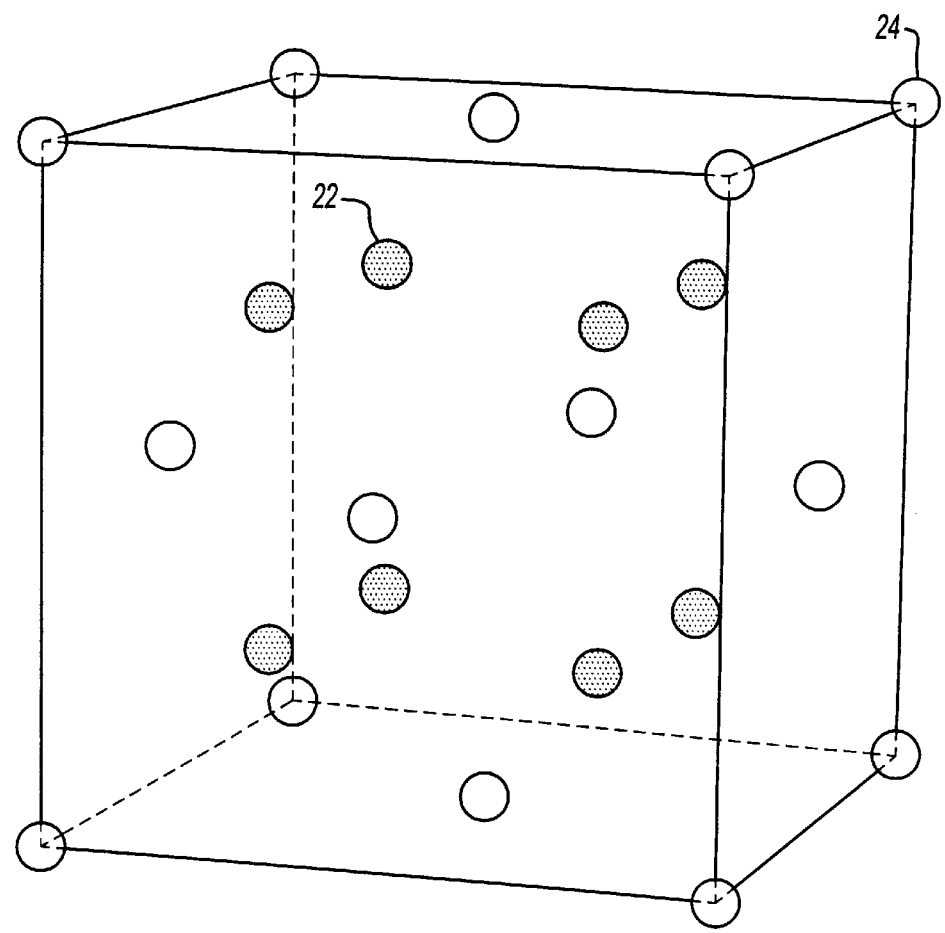
FIG. 2 is a graphical depiction of one exemplary structure of a $CaF_2$ material of the present invention showing the respective Ca and F unit cell positions.

FIG. 2 illustrates a typical crystal structure type for one exemplary composition of the present invention based upon the binary $CaF_2$ system. The darkened circles (see, e.g., reference numeral 22) represent fluorine atoms, and the outlined circles (see, e.g. reference numeral 24) represent calcium atoms. In instances where the preferred material is based on $Mg_2Sb$, the Mg typically would be located where the F atoms are, and the Sb typically would be located where the Ca atoms are depicted.

The thermoelectric material according to the present invention exhibits a ZT of at least about 0.4, and is capable of exhibiting a ZT of at least about 1.2, more preferably at least about 1.5, still more preferably at least about 1.7, even still more preferably at least about 2 and even still more preferably at least about 3. The material exhibits a resistivity of at most about 30 milliohms-cm. Moreover, the resulting preferred material can exhibit a band gap of at least about 0.05 eV, and preferably about 0.10 and about 0.15 eV. Finally, the material is capable of exhibiting an estimated Seebeck coefficient in excess of about 100 microvolts/K; more preferably greater than about 200 microvolts/K.

Materials of the present invention can be synthesized or produced using any of a number of conventional methods, including but not limited to high energy ball milling, solid state mixing of pure metal powders, electrochemical routes, arc melting followed by quenching, high pressure synthesis, solid state metathesis, vapor phase transport, organometallic precursors, or atomization of pre-alloyed metals followed by a rapid quench.

In another embodiment, the materials are more finely tuned through the use of additional materials. For example, the materials of the present invention can be alloyed with other materials that exhibit desirable thermoelectric properties. The materials of the present invention may also be employed in combination (e.g. as a composite or laminate structure) with other suitable materials. Thermoelectric properties of various devices may be also be coated with the material of the present invention to selectively alter the device's thermoelectric characteristics.

In a preferred embodiment, a thermoelectric device is made by thin film physical vapor deposition of thermoelectric material to generate the thermoelectric elements. In another embodiment, the columns are prepared from powder processing. The thermoelectric elements can then be assembled along with the conductors and electrodes onto the support plates.

What is claimed is:

1. A thermoelectric article, comprising:
a material adaptable for inclusion in a thermoelectric device, wherein said material has the formula $A_xM_yB_z$ wherein A is one or more element selected from the group consisting of Be, Mg, Ca, Sr, Ba, Al, Y, La, Ce, Pr, Nd, Pm, Sm, Eu, Gd, Th, Dy, Ho, Er, Tm, Yb, Lu, Sc and mixtures thereof; and B is one or more element selected from the group consisting of P, As, Sb, Bi, Ge, Pb, Se, Te and mixtures thereof, and M is a transition metal, a noble metal, or a mixture thereof; x ranges from about 59 to about 72, y ranges from about 0 to about 15, and z ranges from about 25 to about 33.

2. The article according to claim 1 wherein said M is copper.

3. The article according to claim 1 wherein x is about 2, y is about 1 and z is about 0.

4. The article according to claim 1 wherein said M is selected from the group consisting of Cu, Ag, Au, Pd, Pt, Ni, Mn, Fe, Co, Ni, Zn, and mixtures thereof.

5. The article according to claim 1 wherein said M is selected from the group consisting of Cu, Ag, Mn, Fe, Co, Ni, Zn and mixtures thereof.

6. The article according to claim 1 wherein said A is selected from the group consisting of Mg, Ca, Y and mixtures thereof.

7. The article according to claim 1 wherein said B is selected from the group consisting of Sb, Pb, Ge and mixtures thereof.

8. The article according to claim 1 wherein said M is copper, A is magnesium, and B is antimony.

9. The article according to claim 1 wherein said x ranges from about 61 to about 68.

10. The article according to claim 1 wherein said y ranges from about 4 to about 6.

11. The article according to claim 1 wherein said z ranges from about 26 to about 33.

12. The article according to claim 1 wherein said A is Mg, said B is Sb, said M is Cu, x is about 61 to about 68, y is about 4 to about 6 and z is about 26 to about 33.

13. A thermoelectric device, comprising:

an element adapted for inclusion in a thermoelectric device, wherein said element includes a material having the formula $Mg_xM_ySb_z$, wherein M is a transition metal, a noble metal or a mixture thereof, x ranges from about 59 to about 72, y ranges from about 0 to about 15, and z ranges from about 25 to about 33; and further wherein said device exhibits a ZT greater than about 0.4.

14. The device according to claim 13 wherein said device exhibits a ZT greater than about 1.

15. The device according to claim 13 wherein said device exhibits a ZT greater than about 1.7.

16. The device according to claim 13 wherein said device exhibits a ZT greater than about 2.

17. The device according to claim 13 wherein said device exhibits a ZT greater than about 2.5.

18. The device according to claim 13 wherein said device exhibits a ZT greater than about 3.

19. The device according to claim 13 wherein said M is copper.

20. A thermoelectric material having a formula of $Mg_xCu_ySb_z$, wherein x ranges from about 59 to about 72, y ranges from 0 to about 15, and z ranges from about 25 to about 33, and further wherein said material exhibits a ZT figure of merit of at least about 0.4.

21. The material of claim 20, wherein said material exhibits a ZT figure of merit of at least about 3.

22. An improved element for inclusion in a thermoelectric device, said element comprising a material having the formula $Mg_xM_ySb_z$, wherein M is selected from the group consisting of Cu, Ag, Mn, Fe, Co, Ni, Zn and mixtures thereof, x ranges from about 61 to about 68, y ranges from about 2 to about 8, and z ranges from about 25 to about 33; and further wherein said material exhibits a ZT figure of merit greater than about 0.4.

23. The element of claim 22, wherein said material exhibits a band gap of at least 0.05 eV.

24. The element of claim 22, wherein said material exhibits a ZT figure of merit of at least about 2.

25. The element of claim 22, wherein said material exhibits a ZT figure of merit of at least about 3.

26. An improved element for inclusion in a thermoelectric device, said element comprising a material having the formula $Mg_xM_ySb_z$, wherein M is a transition metal, a noble metal or a mixture thereof, x ranges from about 61 to about 68, y ranges from about 4 to about 6, and z ranges from about 26 to about 33; and further wherein said material exhibits a ZT figure of merit greater than about 0.4.

27. The element of claim 26, wherein said material exhibits a band gap of at least 0.05 eV.

28. The element of claim 26, wherein said material exhibits a ZT figure of merit of at least about 2.

29. The element of claim 26, wherein said material exhibits a ZT figure of merit of at least about 3.

30. An improved material for inclusion in a thermoelectric device, said material comprising a material having the composition $Mg_xCu_ySb_z$, wherein x ranges from about 61 to about 68, y ranges from about 2 to about 8, and z ranges from about 25 to about 33; and further wherein said material exhibits a ZT figure of merit greater than about 0.4, a resistivity of less than about 30 milliohms-cm, and a Seebeck coefficient greater than about 100 microvolts/K.

31. The material of claim 30, wherein said material exhibits a band gap of at least 0.05 eV.

32. The material of claim 30, wherein said material exhibits a Seebeck coefficient greater than about 200 microvolts/K.

33. The material of claim 32, wherein said material exhibits a ZT figure of merit of at least about 3.

34. The material of claim 30, wherein said material exhibits a ZT figure of merit of at least about 2.

35. The material of claim 30, wherein said material exhibits a ZT figure of merit of at least about 3.

* * * * *

UNITED STATES PATENT AND TRADEMARK OFFICE
CERTIFICATE OF CORRECTION

PATENT NO.      : 6,225,550 B1                                    Page 1 of 1
DATED           : May 1, 2001
INVENTOR(S)     : Marc Hornbostel and William B. Archibald It is certified that error appears in the above-identified patent and that said Letters Patent is hereby corrected as shown below:

<u>Column 4,</u>
Line 34, replace "Th" with -- Tb --.

Signed and Sealed this

Seventeenth Day of December, 2002

JAMES E. ROGAN
*Director of the United States Patent and Trademark Office*